United States Patent [19]

Marchisi

[11] Patent Number: 5,034,800
[45] Date of Patent: Jul. 23, 1991

[54] HOLLOW PLASTIC PACKAGE FOR SEMICONDUCTOR DEVICES

[75] Inventor: Giuseppe Marchisi, Milan, Italy

[73] Assignee: SGS-Thomson Microelectronics s.r.l., Italy

[21] Appl. No.: 366,840

[22] Filed: Jun. 15, 1989

[30] Foreign Application Priority Data

Jun. 22, 1988 [IT] Italy .................. 83642 A/88

[51] Int. Cl.⁵ .................. H01L 23/28; H01L 39/02
[52] U.S. Cl. .................. 357/72; 174/52.1; 357/80
[58] Field of Search .......... 357/72, 70, 80; 174/52

[56] References Cited

U.S. PATENT DOCUMENTS

| | | | |
|---|---|---|---|
| 3,665,256 | 5/1972 | Goun et al. | 357/81 |
| 3,778,685 | 12/1973 | Kennedy | 317/234 |
| 4,012,579 | 3/1977 | Fox et al. | 174/52 |
| 4,644,384 | 2/1987 | Charoensakvirochana et al. | 357/74 |
| 4,663,833 | 5/1987 | Tanaka et al. | 29/588 |
| 4,722,060 | 1/1988 | Quinn et al. | 364/490 |
| 4,855,868 | 8/1989 | Harding | 361/386 |

FOREIGN PATENT DOCUMENTS

| | | | |
|---|---|---|---|
| 135425 | 5/1979 | Fed. Rep. of Germany | 357/72 |
| 58-4953 | 1/1983 | Japan | 357/72 |
| 58-89844 | 5/1983 | Japan | 357/72 |
| 1329810 | 6/1973 | United Kingdom | 357/72 |

OTHER PUBLICATIONS

Patent Abstracts of Japan, vol. 10, No. 209, Jul. 22, 1986, 61-048944 (Matsushita Electronics).
Patent Abstracts of Japan, vol. 12, No. 221, 63-015448 (Nitto Electric).
Patent Abstracts of Japan, vol. 9, No. 298, 60-136347 (Hitachi Maikuro Computer Engineering).
Patent Abstracts of Japan, vol. 6, No. 155, 57-076867 (Nippon Denki).

*Primary Examiner*—Jerome Jackson, Jr.
*Assistant Examiner*—Donald L. Monin
*Attorney, Agent, or Firm*—Pollock, Vande Sande & Priddy

[57] ABSTRACT

A hollow-type package of optically and non-optically active semiconductor devices is entirely made of moldable plastic material by utilizing a preformed box-like shell of a rigid plastic material for enclosing the semiconductor dye and the electrical connection wires before molding the shell in an epoxy resin. The protective shell is composed of two corresponding half parts and, in the case of optically active devices, the top half of the shell is provided with a window closed by a transparent pane which is sealed during the encapsulation. Preferably, the two halves of the protection shell have two spaced lateral walls forming two spaced sealing perimeters and a perimetral chamber which is formed therebetween and surrounds a central cavity of the shell for accommodating any encapsulating resin which may eventually enter through the outer sealing perimeter during molding. The central cavity of the shell may be filled with a nonrigid silicon resin before molding for further increasing the protection. The entirely plastic hollow package may be formed through a normal plastic molding process.

4 Claims, 2 Drawing Sheets

HOLLOW PLASTIC PACKAGE FOR SEMICONDUCTOR DEVICES

BACKGROUND OF THE INVENTION

1. Field of the invention

The present invention relates to semiconductor devices and to the techniques of assembly thereof. In particular it relates to a cavity-type package for optically encapsulating active devices made entirely of plastic which may be easily equipped with a transparent window.

2. Description of the prior art

Optically active devices such as EPROM, optical sensors and video camera sensors, as well as integrated circuits built on relatively large size silicon chips are very sensitive to stresses induced by the shrinkage of an encapsulating epoxy resin such as the resin commonly used for molded wholly plastic packages. Therefore, such devices require the use of metallic or ceramic hollow-type packages which are relatively very expensive both because of the materials utilized and the fabrication process used.

SUMMARY OF THE INVENTION

An objective of this invention is to provide a hollow or cavity-type package which is made entirely with a plastic material, is compatible with substantially standard fabrication techniques and is relatively inexpensive.

Essentially the package of the present invention utilizes a box-like shell of a substantially rigid plastic material, formed by two matching halves, for enclosing the semiconductor die bonded on the central pad of a metallic frame and the electrical connection wires thereto, thus preventing the encapsulating resin from encroaching inside the shell during molding. When encapsulating optically active devices, one of the two halves of the box-like shell is provided with a window, sealed by means of a small pane of glass or of an equivalent transparent material. Moreover, the free space within a central cavity of the shell containing the semiconductor die may be filled, at least partially, with a protecting silicone resin in order to improve the protection provided by the shell and for more effectively preventing encroachment of encapsulating resin inside the central cavity during the molding of the package.

DESCRIPTION OF THE PREFERRED EMBODIMENTS

FIGS. 1 to 4 show a preferred embodiment of the present invention as applied to the case of an optically active semiconductor device requiring a package provided with at least an optically transparent window through which the front of the semiconductor device containing the optically active components may be illuminated.

Figure 1:
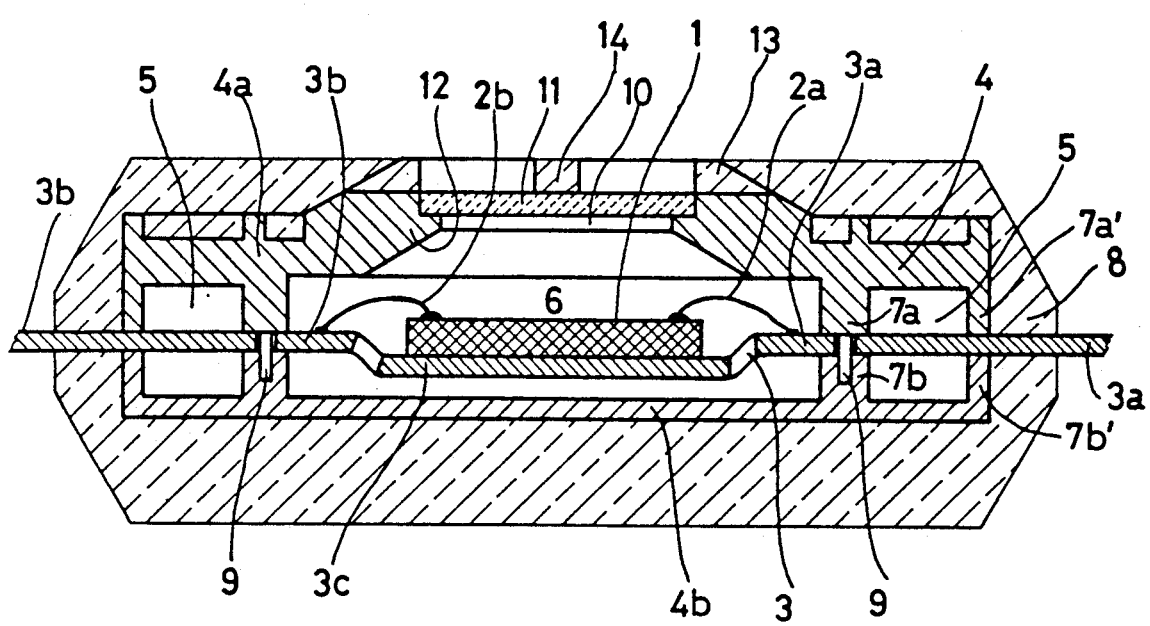
FIG. 1 is a sectional view of a semiconductor device encapsulated in a hollow plastic package of the present invention, provided with a transparent window.
Figure 2:
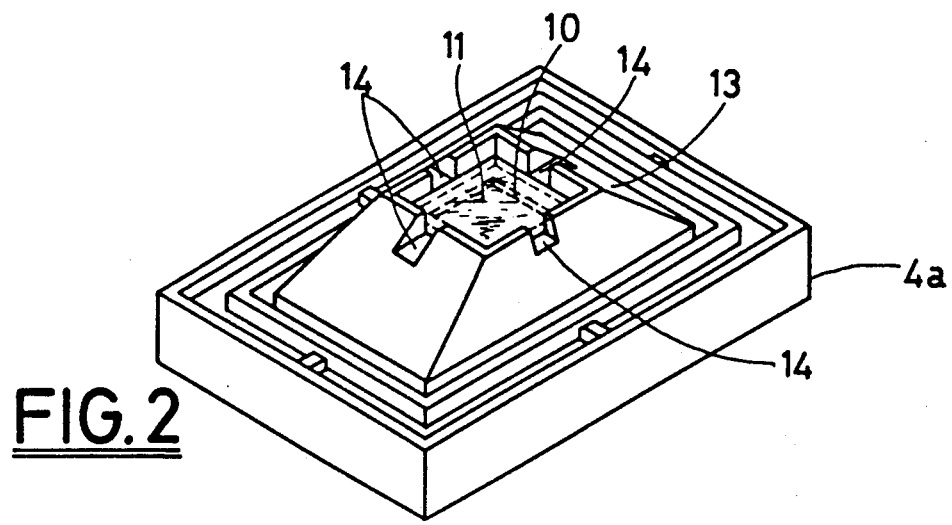
FIG. 2 is a perspective view of the top half of the rigid plastic box used in the package of FIG. 1.

In the figures, a silicon die 1 constitutes the semiconducting substrate on which, by means of deposition, implantation and diffusion techniques, circuit components of various types may be formed, among which also optically active components, as well as the necessary electrical interconnections for realizing an integrated circuit. Distributed along the perimeter of the top face of the die 1 there is a plurality of metallized pads to which wires for electrical connection to the external pins of the device are welded. Such electrical connections are made by metal wires (2a, 2b, ...) welded at one end onto respective connection pads of the top surface of the die 1 and at the other end to respective coplanar metal fingers (3a, 3b, ...). The metal fingers extend generally in a radial direction and upon completion of the assembly, are electrically insulated from each other and extend outside the encapsulating plastic package thus forming pins of the device for electrically connecting it to an external circuit. The coplanar fingers are originally part of a metal frame, commonly of copper or of silvered copper, made by stamping a thin continuous metal band. The metal frame, indicated with 3 as a whole in FIG. 1, is provided with a central pad 3c, which is preferably "lowered" in respect to the plane of the radial sectors constituting the fingers 3a, 3b, .... The silicon die 1 is bonded on the top surface of such a central pad of the metal frame utilizing an adhesive resin loaded with metal powders and which, after curing, becomes essentially a good conductor of electricity and heat. The metal frame thus constitutes an essential means for heat dissipation.

The silicon die 1, the inner ends of the coplanar fingers 3a, 3b, ..., as well as the connecting metal wires 2a, 2b, ..., welded thereto, are enclosed within a box-like shell, indicated as a whole with 4, made of a rigid plastic material and formed by two corresponding halves, 4a and 4b respectively. As it is observed in FIG. 1, the coplanar fingers of the metal frame extend outside the shell 4 passing through a gap between the matching edges of the two halves 4a and 4b of the box. The two halves of the shell may be molded using a moldable resin such as for example a powder loaded nylon or any other moldable thermoplastic resin capable of retaining a sufficient stiffness up to a temperature of 180-190° C., for at least a relatively brief period of exposition being between 10 and 15 seconds.

The box 4, having a size sufficient to enclose the die and the connecting wires welded to the ends of the fingers of the metal frame, must be capable to act as a protective shell during the molding of the resin package of the device by preventing the encapsulating resin to flow into contact with the silicon die and with the connecting wires. The resin encapsulates the shell and an intermediate portion of the metal fingers of the frame in an entirely plastic, hollow-type package 8. Therefore problems caused by the shrinkage of the encapsulating resin when cooling down after molding, such as the generation of stresses in the silicon die, and/or breakage of wire connections, are effectively prevented. Other problems of chemical and electrochemical nature due to the fact that the encapsulating resins, commonly based on epoxy resins, have strong ionic charges which may negatively interfere and/or originate electrocorrosion and migration phenomena which may cause failure of the integrated circuit, are also prevented.

Moreover the practice of using a so-called "coating" resin applied on the surface of the die and on the electrical connection wires for protecting them during molding of the plastic package is made particularly simple and effective when applied to the protective shell of the present invention package. Therefore, according to a preferred embodiment of the invention, the empty space inside the central cavity of the shell, containing the die and the connecting wires, is advantageously filled with a transparent, nonrigid plastic material, for example, a highly pure silicone resin having a hardness not higher than about 70 Shore. The use of such a "coating" resin enhances the "sealing-off" of the die with respect to possible intrusions of encapsulating resin inside the cavity by extrusion through gaps between the mating edges of the two halves of the shell.

In order to increase further the protection provided by the shell, it is preferably furnished with an auxiliary perimetral chamber 5 around the central cavity 6 enclosing the semiconductor die and the electric connecting wires. Such a perimetral chamber 5 is obtained by forming both halves 4a and 4b of the shell with two spaced (double) lateral walls, 7a and 7a', 7b and 7b', respectively, thus forming a first inner sealing perimeter (opposing edges of the inner lateral walls 7a and 7b) and a second outer sealing perimeter (opposing edges of the outer lateral walls 7a' and 7b') around the central cavity 6 of the shell. In this way, during the molding of the encapsulating plastic body 8, the encapsulation resin which occasionally may extrude through gaps of such an external sealing perimeter is accommodated into such an auxiliary perimetral chamber 5 without encroaching inside the central cavity 6 of the shell. The box-like shell 4 may be provided with suitable centering pins for facilitating the positioning of the metal frame carrying the semiconductor die inside the shell. In the embodiment shown in FIG. 1, the edge of the inner wall 7b of the lower half 4b of the shell is provided with at least two centering pins 9 cooperating with centering holes formed in the metal frame 3. These centering pins may be constituted by projections formed on one of the edge of the shell's halves during molding thereof.

In the embodiment shown in the figures, disclosing to a device containing optical active components, the top half 4a of the shell is provided with a central window 10 which is closed by a sheet of a transparent rigid material 11, for example, of quartz. The opening of the window in the top half of the shell may be conveniently configured in a way such as to provide a perimetral flange portion 12 on which the transparent pane 11 may rest. The window's opening is contoured by a frame portion 13 inside which the glass pane 11 may be inserted. The frame may be provided with slots 14 distributed along the sides of the perimeter thereof for facilitating the spreading of the encapsulating resin during the molding of the encapsulating resin body 8 in order to seal the perimeter of the transparent window pane 11 by forming a sealing seam along the inner perimeter of the frame 13 of the top half of the shell. Naturally while molding the encapsulating body 8, the top counter-plate of the mold will have an appropriate projection which will abut on the top surface area of the transparent window pane 11 which must not be covered by the encapsulating resin.

Figure 4:
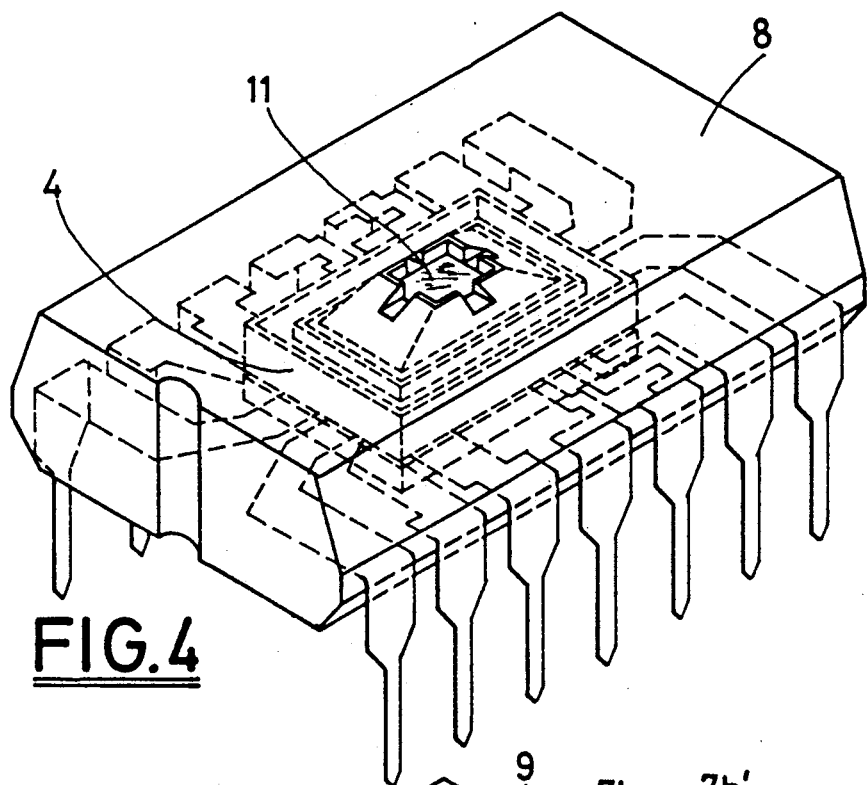
FIG. 4 is a perspective schematic view of the semiconductor device entirely encapsulated in a plastic package in accordance with the present invention.
Figure 3:
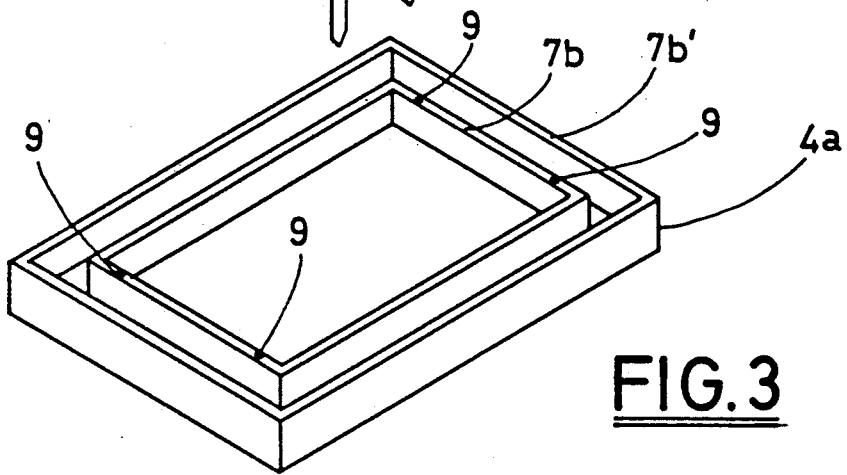
FIG. 3 is a perspective view of the bottom half of the rigid plastic box used in the package of FIG. 1.

The finished device is encapsulated in a substantially hollow, entirely plastic package in accordance with the present invention and may be provided with a transparent window as shown in FIG. 4, wherein by means of dash lines, the shape of the embedded shell 4 containing the die and the connecting wires within the encapsulating resin body 8 is depicted.

Although the embodiment shown relates to the case of optically active devices requiring the presence of a transparent window in the package, it is clear that the package of the invention, including a protective shell of a rigid plastic material, is useful also for other types of devices for which although an optically transparent window in the package may not be required, it is also not recommended to use a conventional molded plastic package. In all these cases, the entirely plastic package of the invention may be advantageously used in lieu of a more expensive hollow, ceramic or metallic package. As it will be evident to the skilled technician, the entirely plastic, hollow package of the present invention can be made using a conventional process of plastic encapsulation of semiconductor devices. The operations of bonding the silicon die to the metal frame and of welding the connecting wires to the pads on the silicon die and to the fingers of the metal frame by gold wire welding may be performed according to standard techniques. The positioning of the two halves of the protecting box-like shell around the die and the wires, optionally applying a certain amount of a "coating" resin to the die and wires, is clearly compatible with a conventional assembly flow-sheet.

The molding of the encapsulating body using a conventional epoxy resin may also be carried out by a normal injection molding technique of the so-called "transfer-molding" type. This technique contemplates molding of an epoxy resin at a temperature of about 160° C. and the material of the protective shell must of course be capable of retaining a sufficient stiffness at such a molding temperature of the encapsulating epoxy resin.

What I claim is:

1. A package for a semiconductor device including a semiconductor die having two major parallel surfaces and a plurality of metal pads defined on one surface thereof for electrical connections, the other surface thereof being bonded by means of a heat and electricity conducting adhesive to a central pad of a metal frame, the metal frame also having a plurality if coplanar fingers which surround the central pad at a distance therefrom and extend substantially in a radial direction, the fingers being electrically insulated from each other, each of the metal pads being connected to at least one of the fingers by means of a metal wire which is welded at its one end to the metal pad and at the other end to a relative finger of the metal frame, said package comprising:

a box-like, substantially hollow shell made of a substantially rigid plastic material, said shell being formed by two corresponding parts, the two parts of said box-like shell having two spaced lateral walls forming a first inner sealing perimeter and a second outer sealing perimeter and a perimetral chamber which is formed therebetween, which surrounds a central cavity of the shell enclosing said die, said welded metal wires and at least the inner ends of said radially extending coplanar fingers, the other ends of said fingers passing outside said shell through a gap formed between opposing peripheral edges of said two spaced lateral walls of the two halves of said shell;

an encapsulating plastic body molded around said box-like shell and from which the outer ends of said radially extending fingers of the metal frame project, said perimetral chamber accommodating any encapsulating resin material extruding through gaps in said outer sealing perimeter during the molding of said encapsulating resin body.

2. The package according to claim 1, wherein the empty space of the cavity of said hollow, box-like shell enclosing said die and welded wire connections is filled with a nonrigid inert resin before molding the encapsulating plastic body.

3. The package according to claim 1, wherein at least one part of said box-like shell is provided with at least two centering pins cooperating with centering holes provided in said metal frame.

4. The package according to claim 1, wherein one part of said box-like shell is provided with a window hermetically closed by a pane of a transparent rigid material, with said encapsulating plastic body being adapted to surround and seal the periphery of said pane.

* * * * *